US008901976B2

(12) United States Patent
Nakayama et al.

(10) Patent No.: US 8,901,976 B2
(45) Date of Patent: Dec. 2, 2014

(54) SYNCHRONIZING CIRCUIT AND CLOCK DATA RECOVERY CIRCUIT INCLUDING THE SAME

(71) Applicant: LAPIS Semiconductor Co., Ltd., Yokohama (JP)

(72) Inventors: Akira Nakayama, Yokohama (JP); Kunihiro Harayama, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 14/065,029

(22) Filed: Oct. 28, 2013

(65) Prior Publication Data

US 2014/0118040 A1    May 1, 2014

(30) Foreign Application Priority Data

Oct. 31, 2012 (JP) ................................. 2012-240380

(51) Int. Cl.
  *H03L 7/06* (2006.01)
  *H03L 7/085* (2006.01)
(52) U.S. Cl.
  CPC ...................................... *H03L 7/085* (2013.01)
  USPC ........... 327/157; 327/148; 327/143; 327/147; 327/156
(58) Field of Classification Search
  USPC .............. 327/141, 144–163; 331/1 A, 15–17; 375/373–376
  See application file for complete search history.

(56) References Cited

U.S. PATENT DOCUMENTS

| 5,473,639 | A * | 12/1995 | Lee et al. ........................ 375/376 |
| 6,307,411 | B1 * | 10/2001 | Kerner ............................ 327/156 |
| 2004/0000937 | A1 * | 1/2004 | Byun et al. ..................... 327/158 |
| 2007/0176656 | A1 * | 8/2007 | Lesso ............................. 327/158 |
| 2010/0074037 | A1 * | 3/2010 | Lin ................................ 365/194 |
| 2011/0025913 | A1 * | 2/2011 | Sugiyama ..................... 348/500 |
| 2012/0306551 | A1 * | 12/2012 | Moon et al. ................... 327/149 |
| 2013/0002320 | A1 * | 1/2013 | Lin et al. ....................... 327/158 |

FOREIGN PATENT DOCUMENTS

JP     2011-030058 A    2/2011

* cited by examiner

*Primary Examiner* — Brandon S Cole
(74) *Attorney, Agent, or Firm* — Studebaker & Brackett PC

(57) ABSTRACT

A synchronizing circuit that is capable of generating a reproduced clock signal synchronized with a reference clock signal without causing a false lock and a clock data recovery circuit including the same are provided. To generate a clock signal synchronized with a reference clock signal associated with a data transition point that appears every predetermined period in an input data signal, the following false-lock avoidance processing is performed. That is, precharging of a first line is started when a phase control voltage applied to the first line by a charge pump falls below a lower-limit reference voltage, and the precharging of the first line is continued until the phase control voltage exceeds an upper-limit reference voltage.

12 Claims, 12 Drawing Sheets

SYNCHRONIZING CIRCUIT AND CLOCK DATA RECOVERY CIRCUIT INCLUDING THE SAME

BACKGROUND OF THE INVENTION

1. Field of the Invention

The present invention relates to a synchronizing circuit for generating a reproduced clock signal synchronized with a reference clock signal and a clock data recovery circuit (hereinafter to be referred to as a CDR circuit) including the synchronizing circuit.

2. Description of the Related Art

Currently employed as a high-speed serial data communication scheme is an embedded clock scheme in which a clock signal is superimposed on data signals for transmission.

A receiver in a communication system that employs the embedded clock scheme is provided with a CDR circuit for acquiring a reproduced clock signal in phase with a data transition point from a received data signal with the help of the periodicity of data transition of the received data signal (for example, see FIG. 5 in Japanese Patent Application Laid-Open No. 2011-30058). The CDR circuit includes a phase locked loop (PLL) circuit which is made up of a phase/frequency detector, a charge pump, a loop filter, a voltage control oscillator, and a frequency divider (for example, see FIG. 5 in Japanese Patent Application Laid-Open No. 2011-30058).

However, in some cases, various factors would cause a false lock by which the frequency of a reproduced clock signal is locked to a frequency higher than a desired frequency, in the case of which it cannot be ensured to receive data with reliability.

In this context, such a CDR circuit is provided with a false-lock detection circuit for detecting whether there has occurred a false lock in the PLL circuit serving as the synchronizing circuit (for example, symbol 40 of FIG. 5 in Japanese Patent Application Laid-Open No. 2011-30058). This false-lock detection circuit detects whether there has occurred a false lock on the basis of the data train pattern that is obtained by sampling, at the timing of the reproduced clock signal mentioned above, a false-lock detection training pattern included in a received data signal. If a false lock is detected, then the false-lock detection circuit forcedly reduces the voltage supplied to a voltage control oscillator in the PLL circuit, thereby lowering the frequency of the reproduced clock signal that has been locked to a frequency higher than a desired frequency.

Furthermore, for example, external noise may cause a phase/frequency detector in the PLL circuit to malfunction, so that only those signals that are associated with a phase lead (or lag) continue to be supplied to a charge pump. This would cause the output from the charge pump to be fixed at a zero level. Thus, when a new data signal is received after that, the PLL circuit starts the initial synchronization with the output of the charge pump at the zero level. Thus, at this time, the synchronizing circuit having a feedback loop, such as the PLL circuit, may possibly be subjected to a false lock at a frequency different from a desired frequency.

SUMMARY OF THE INVENTION

It is an object of the present invention to provide a synchronizing circuit which is capable of generating a reproduced clock signal synchronized with a reference clock signal without causing a false lock and a clock data recovery circuit including the same.

A synchronizing circuit according to the present invention generates a reproduced clock signal synchronized with a reference clock signal. The synchronizing circuit includes: a charge pump for generating a phase control voltage having a voltage value associated with a phase difference between the reference clock signal and the reproduced clock signal and for delivering the resulting voltage to a first line; a phase control circuit for providing phase control to the reproduced clock signal depending on the phase control voltage; and a false-lock avoidance circuit for starting to precharge the first line when the phase control voltage falls below a lower-limit reference voltage and for continuing the operation of precharging the first line until the phase control voltage exceeds an upper-limit reference voltage.

Furthermore, a clock data recovery circuit according to the present invention has clock generation means for generating a reference clock signal synchronized with a data transition point that appears every predetermined period in an input data signal and synchronizing means for generating a reproduced clock signal synchronized with the reference clock signal. The synchronizing means includes: a charge pump for generating a phase control voltage having a voltage value associated with a phase difference between the reference clock signal and the reproduced clock signal and for delivering the resulting voltage to a first line; a phase control circuit for providing phase control to the reproduced clock signal depending on the phase control voltage; and a false-lock avoidance circuit for starting to precharge the first line when the phase control voltage falls below a lower-limit reference voltage and for continuing the operation of precharging the first line until the phase control voltage exceeds an upper-limit reference voltage.

According to the present invention, to generate a clock signal synchronized with a reference clock signal by a synchronizing circuit that includes a charge pump, the following false-lock avoidance processing is performed. That is, precharging of a first line is started when a phase control voltage applied to the first line by the charge pump falls below a lower-limit reference voltage, and the operation of precharging the first line is continued until the phase control voltage exceeds an upper-limit reference voltage.

Since this allows the first line to be forcedly precharged, it is possible to retain the phase control voltage at a high voltage value even when external noise has substantially stopped the operation of the charge pump.

According to the present invention, it is therefore possible to avoid the false lock which would be otherwise caused when the synchronizing circuit has started an initial synchronization with the phase control voltage at a low voltage in the vicinity of the ground voltage.

DETAILED DESCRIPTION OF THE INVENTION

Figure 1:
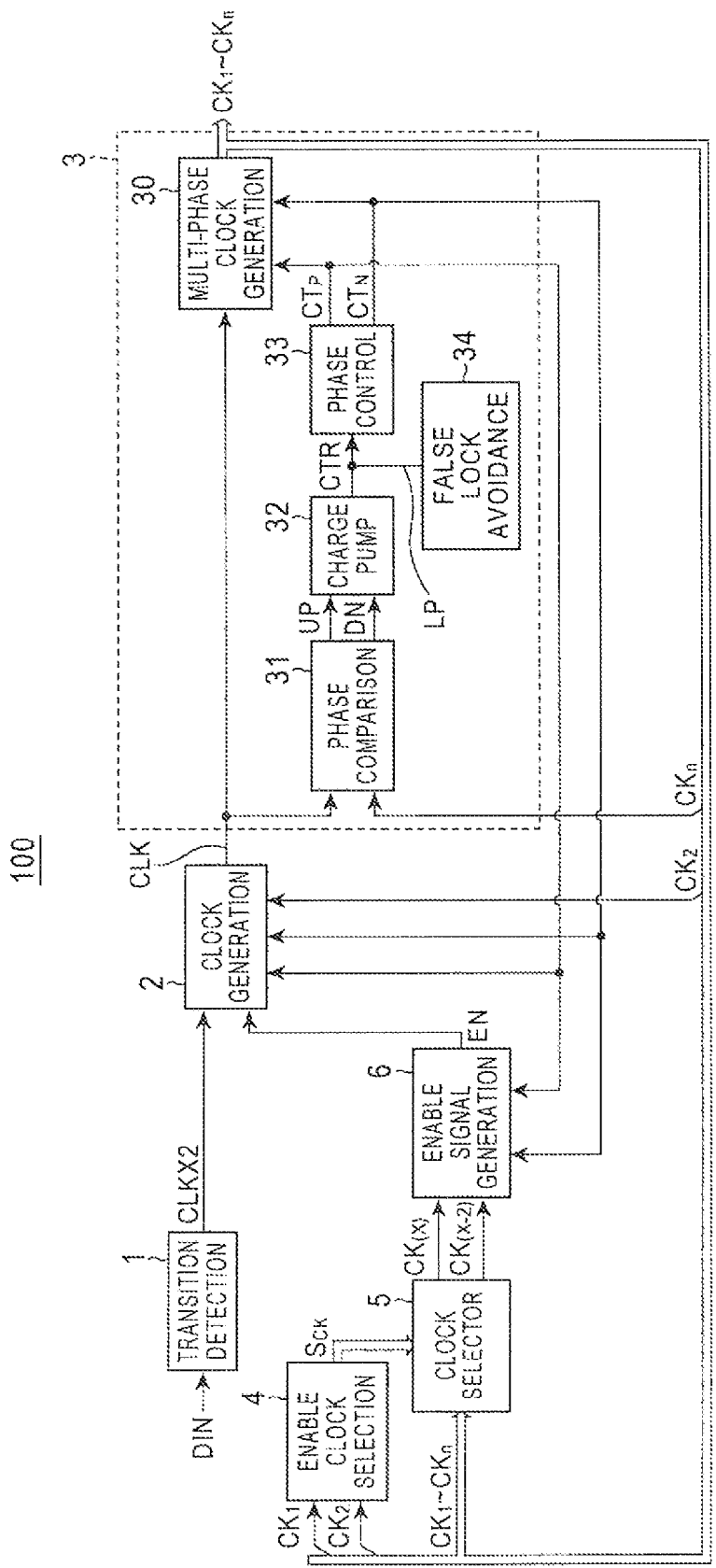
FIG. 1 is a block diagram illustrating the configuration of a clock data recovery circuit 100 which includes a DLL circuit 3 serving as a synchronizing circuit according to the present invention.

FIG. 1 is a block diagram illustrating a clock data recovery circuit 100 which includes a DLL circuit 3 serving as a synchronizing circuit according to the present invention.

Figure 2:
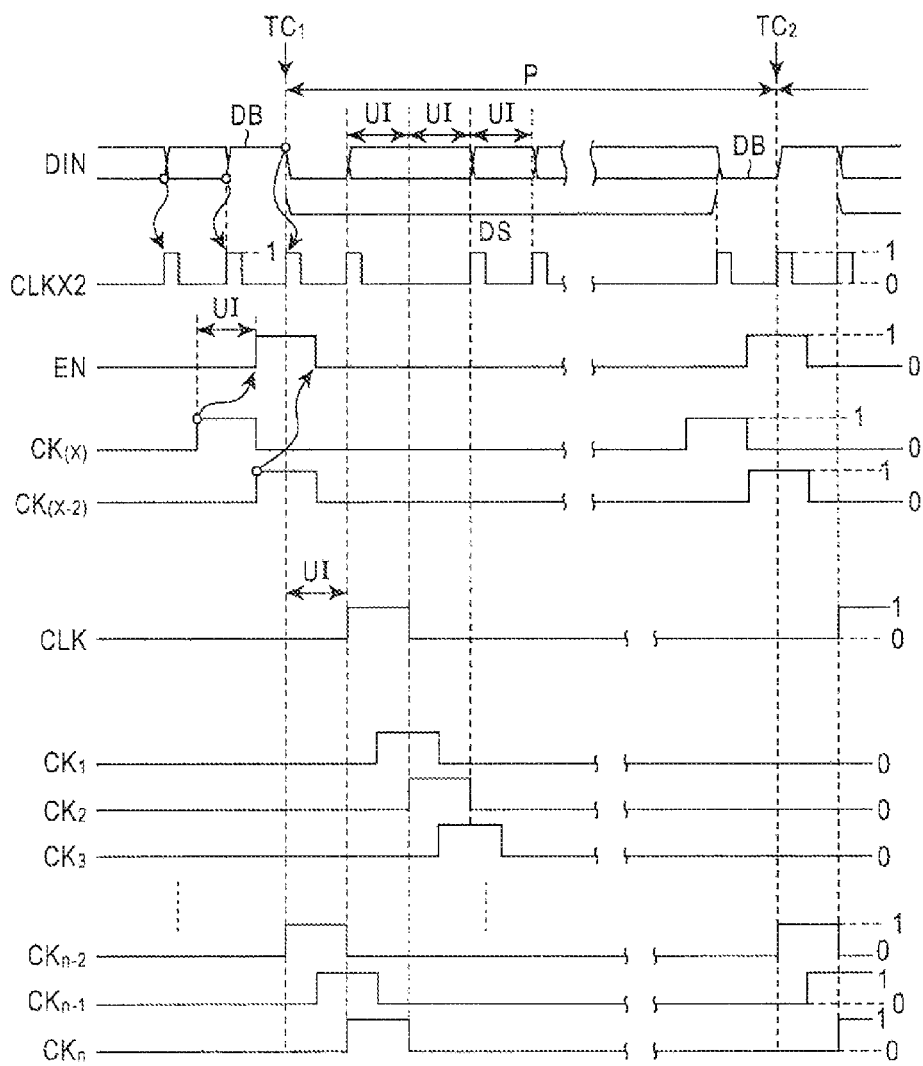
FIG. 2 is a time chart showing an internal operation of the clock data recovery circuit 100.

The clock data recovery circuit 100 shown in FIG. 1 is formed in a semiconductor IC mounted on a receiver device (not shown). Such a receiver receives, demodulates, and binary-codes a transmission signal transmitted by a transmitter (not shown) in order to produce a received data signal DIN. At this time, as shown in FIG. 2, the received data signal DIN has a one-bit dummy bit DB at reference transition periods P inserted into a data train DS of a plurality of data bits each having a unit data period UI. At this time, as shown in FIG. 2, when the leading data bit of the data train DS is at logic level 0, the dummy bit DB at logic level 1 is inserted immediately before the same. On the other hand, when the leading data bit is at logic level 1, the dummy bit DB at logic level 0 is inserted immediately before the same. Thus, in the received data signal DIN a reference transition TC appears which transitions at the reference transition periods P from logic level 1 to logic level 0 or from logic level 0 to logic level 1 at the rear edge of the dummy bit DB.

Now, a description will be made in turn to each component of the clock data recovery circuit 100 shown in FIG. 1 with reference to the corresponding drawings, as required. In the received data signal DIN, a transition detection unit 1 detects a rising edge of a data bit transitioning from logic level 0 to logic level 1 and detects a falling edge transitioning from logic level 1 to logic level 0. Upon detection of the edges, the transition detection unit 1 generates a short pulse or a transition detection signal CLKX2 as shown in FIG. 2 and supplies the resulting signal to a clock generation unit 2. That is, the transition detection unit 1 supplies, to the clock generation unit 2, the transition detection signal CLKX2 that indicates the data transition point of the received data signal DIN in the form of a short pulse.

Figure 3:
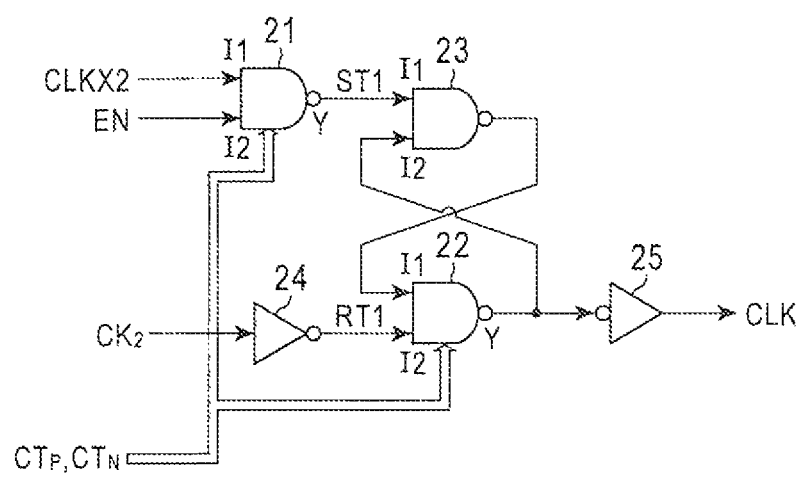
FIG. 3 is a circuit diagram illustrating an example of the internal configuration of a clock generation unit 2.

FIG. 3 is a circuit diagram illustrating the internal configuration of the clock generation unit 2.

As shown in FIG. 3, the clock generation unit 2 is made up of an RS flip-flop (hereinafter to be referred to as an RSFF) which includes variable delay NAND gates 21 and 22, a NAND gate 23, and inverters 24 and 25.

The variable delay NAND gate 21 finds the inverted AND between the transition detection signal CLKX2 supplied from the transition detection unit 1 and an ENABLE signal EN shown in FIG. 2 supplied from an ENABLE signal generation unit 6, to be discussed later, and then supplies a set signal ST1 indicative of the result of the inverted AND to an input terminal I1 of the NAND gate 23. In short, the variable delay NAND gate 21 acquires the transition detection signal CLKX2 only while the ENABLE signal EN is at logic level 1 and then supplies, to the NAND gate 23 as the set signal ST1, a signal obtained by inverting the logic level of the acquired transition detection signal CLKX2. Note that the variable delay NAND gate 21 supplies the aforementioned set signal ST1 to the NAND gate 23 with a delay of 0.5 UI (unit data period) from a point in time at which the transition detection signal CLKX2 has transitioned from logic level 0 to logic level 1. At this time, the time delay at the variable delay NAND gate 21 is adjusted so as to retain 0.5 UI at all times in accordance with a delay adjustment signal ($CT_P$, $CT_N$), to be discussed later. As described above, the variable delay NAND gate 21 operates as variable delay acquiring means which delays the transition detection signal CLKX2 by the unit data period UI in response to the ENABLE signal EN and then acquires the resulting signal. The inverter 24 supplies a signal obtained by inverting the logic level of a reproduced clock signal $CK_2$ (to be discussed later) as a reset signal RT1 to an input terminal I2 of the variable delay NAND gate 22. The input terminal I1 of the variable delay NAND gate 22 is connected with an output terminal of the NAND gate 23, while the output terminal of the variable delay NAND gate 22 is connected with the input terminal I2 of the NAND gate 23 and the input terminal of the inverter 25. Note that the variable delay NAND gate 22 supplies an output result therefrom to each of the NAND gate 23 and the inverter 25 with a delay of 0.5 UI from a point in time at which the reproduced clock signal $CK_2$ has transitioned from logic level 0 to logic level 1. At this time, the time delay at the variable delay NAND gate 22 is adjusted so as to retain 0.5 UI at all times in accordance with the delay adjustment signal ($CT_P$, $CT_N$). The inverter 25 outputs, as a reference clock signal CLK, a signal obtained by inverting the logic level of the signal issued from the variable delay NAND gate 22.

Figure 4:
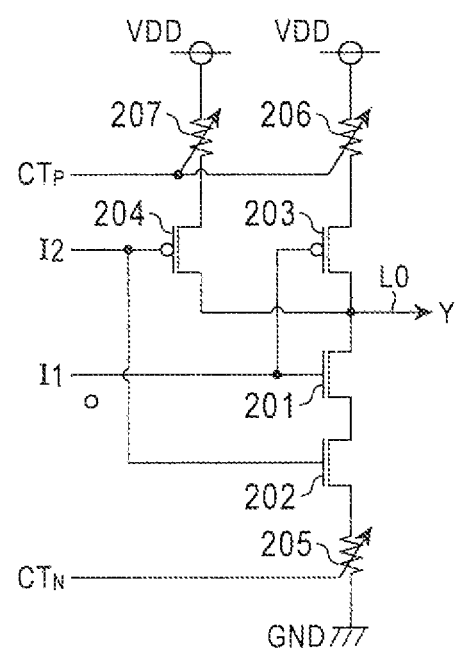
FIG. 4 is a circuit diagram illustrating the internal configuration of variable delay NAND gates 21, 22, and 62.

FIG. 4 is a circuit diagram illustrating an example of the internal configuration of the variable delay NAND gates 21 and 23.

As shown in FIG. 4, each of the variable delay NAND gates 21 and 23 has n-channel metal-oxide semiconductor (MOS) type transistors 201 and 202, p-channel MOS type transistors 203 and 204, and variable resistors 205 to 207.

The transistor 201 has the gate terminal connected to the input terminal I1, and the source terminal connected to the drain terminal of the transistor 202. The drain terminal of the transistor 201 is connected to the drain terminal of each of the transistors 203 and 204 through an output line L0. The transistor 202 has the gate terminal connected to the input terminal I2, and the source terminal connected to one end of the variable resistor 205. The other end of the variable resistor 205 is at a ground voltage GND. The variable resistor 205 can be varied in the resistance value in accordance with the delay adjustment signal $CT_N$ (to be discussed later). The transistor 203 has the gate terminal connected to the input terminal I1, and the source terminal connected to one end of the variable resistor 206. The other end of the variable resistor 206 is at a supply voltage VDD. The transistor 204 has the gate terminal connected to the input terminal I2, and the source terminal connected to one end of the variable resistor 207. The other end of the variable resistor 207 is at the supply voltage VDD. These variable resistors 206 and 207 are varied in the resistance value in accordance with the delay adjustment signal $CT_P$ (to be discussed later). Thus, when a voltage associated with logic level 0 is applied to the input terminal I1 or I2, the transistor 203 or 204 is turned ON, allowing a current to flow into the output line L0 through the variable resistor 206 and the transistor 203 or the variable resistor 207 and the transistor 204. This allows the output line L0 to be charged, so that the voltage of the output line L0 increases with time. At this time, the voltage of the output line L0 is equal to or greater than a threshold voltage at a point in time at which 0.5 UI has elapsed since the voltage applied to the input terminal I1 or I2 has transitioned from logic level 1 to logic level 0. A signal transitioning from logic level 0 to logic level 1 is issued through an output terminal Y.

Here, an increase in the resistance value of the variable resistors 206 and 207 in accordance with the delay adjustment signal $CT_P$ causes a drop in the amount of current for charging the output line L0 and in the rate of increase in the voltage of the output line L0 with time. Thus, it takes more time for the voltage to exceed a threshold voltage, thereby causing an increase in the time delay of a signal issued through the output terminal Y. On the other hand, a decrease in the resistance value of the variable resistors 206 and 207 in accordance with the delay adjustment signal $CT_P$ causes an increase in the amount of current for charging the output line L0 and in the rate of increase in the voltage of the output line L0 with time. Thus, it takes less time for the voltage to exceed the threshold voltage, thereby causing a decrease in the time delay of a signal issued through the output terminal Y. Furthermore, when a voltage associated with logic level 1 is applied to both the input terminals I1 and I2, the transistors 201 and 202 are turned ON, allowing a current to be pulled into the transistors 201 and 202 and the variable resistor 205 through the output line L0. This causes the output line L0 to be discharged and the voltage of the output line L0 to be lowered with time. At this time, the voltage of the output line L0 falls below the threshold voltage at the point in time at which 0.5 UI has elapsed since the voltage associated with logic level 1 started to be applied to both the input terminals I1 and I2, so that a signal for transitioning from logic level 1 to logic level 0 is issued through the output terminal Y. Here, since an increase in the resistance value of the variable resistor 205 in accordance with the delay adjustment signal $CT_N$ causes a decrease in the amount of current for discharging the output line L0, the rate of drop of the voltage of the output line L0 with time is reduced. Thus, it takes more time for the voltage to fall below the threshold voltage, so that an adjustment is to be made to increase the time delay of a signal issued through the output terminal Y. On the other hand, since a decrease in the resistance value of the variable resistor 205 in accordance with the delay adjustment signal $CT_N$ causes an increase in the amount of current for discharging the output line L0, the rate of drop of the voltage of the output line L0 with time is increased. Thus, it takes less time for the voltage to fall below the threshold voltage, so that an adjustment is to be made to reduce the time delay of a signal issued through the output terminal Y.

The aforementioned arrangement allows the clock generation unit 2 to acquire the transition detection signal CLKX2 only when the ENABLE signal EN is at logic level 1. Then, as shown in FIG. 2, the clock generation unit 2 generates the reference clock signal CLK having a pulse waveform which transitions from logic level 0 to logic level 1 at the rising edge timing of the transition detection signal CLKX2, and subsequently, transitions to logic level 0 at the rising edge timing of the reproduced clock signal $CK_2$. Note that as shown in FIG. 2, the clock generation unit 2 including the aforementioned variable delay NAND gates 21 and 22 outputs the reference clock signal CLK at a timing delayed by 1.0 UI from the rising edge timing of the transition detection signal CLKX2 or the reproduced clock signal $CK_2$. At this time, the time delay at the clock generation unit 2 is adjusted for the variable delay NAND gates 21 and 22 to retain 1.0 UI at all times in accordance with the delay adjustment signal ($CT_P$, $CT_N$).

The clock generation unit 2 supplies the reference clock signal CLK to the delay lock loop (hereinafter to be referred to as DLL) circuit 3.

Here, as shown in FIG. 2, the ENABLE signal EN includes a pulse train which transitions from logic level 0 to logic level 1 at the reference transition periods P.

Thus, the clock generation means made up of the transition detection unit 1 and the clock generation unit 2 generates the reference clock signal CLK synchronized with the data transition point which appears at the predetermined reference transition periods P in the input data signal DIN and then supplies the resulting signal to the DLL circuit 3.

The DLL circuit 3 serving as the synchronizing circuit includes a multi-phase clock generation unit 30, a phase comparator 31, a charge pump 32, a phase control circuit 33, and a false-lock avoidance circuit 34.

The phase comparator 31 compares phases between the reference clock signal CLK and a reproduced clock signal CKn (to be discussed later). At this time, the phase comparator 31 supplies a charge-up signal UP to the charge pump 32 when the reproduced clock signal CKn has a phase lag with respect to the reference clock signal CLK, whereas a charge-down signal DN is supplied to the charge pump 32 when the reproduced clock signal CKn has a phase lead with respect to the reference clock signal CLK.

The charge pump 32 generates a phase control voltage CTR which gradually increases in voltage while the charge-up signal UP is being supplied thereto and which gradually decreases in voltage while the charge-down signal DN is being supplied thereto, and then delivers the resulting voltage to the line LP. The phase control voltage CTR delivered from the charge pump 32 is supplied to each of the phase control circuit 33 and the false-lock avoidance circuit 34 through a line LP.

The phase control circuit 33 generates the delay adjustment signals $CT_P$ and $CT_N$ for gradually decreasing the amount of delay while the phase control voltage CTR is increasing. On the other hand, while the phase control voltage CTR is decreasing, the phase control circuit 33 generates the delay adjustment signals $CT_P$ and $CT_N$ for gradually increasing the amount of delay thereof. The phase control circuit 33 supplies the delay adjustment signals $CT_P$ and $CT_N$ to the clock generation unit 2, the ENABLE signal generation unit 6, and the multi-phase clock generation unit 30. That is, the phase control means that is made up of the phase comparator 31, the charge pump 32, and the phase control circuit 33 controls the amount of (phase) delay of each of the clock generation unit 2, the ENABLE signal generation unit 6, and the multi-phase clock generation unit 30 in accordance with the delay adjustment signals $CT_P$ and $CT_N$ associated with the phase difference between one reproduced clock signal CKn among reproduced clock signals $CK_1$ to CKn and the reference clock signal CLK.

Figure 5:
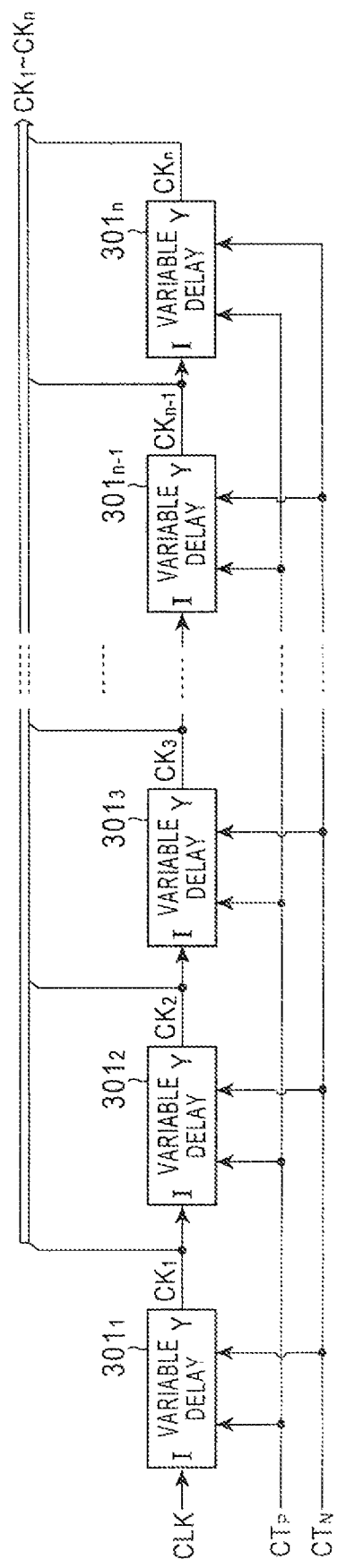
FIG. 5 is a circuit diagram illustrating the internal configuration of a multi-phase clock generation unit 30.

FIG. 5 is a circuit diagram illustrating the internal configuration of the multi-phase clock generation unit 30.

As shown in FIG. 5, the multi-phase clock generation unit 30 is made up of variable delay circuits $301_1$ to $301n$ which are connected in series.

Figure 6:
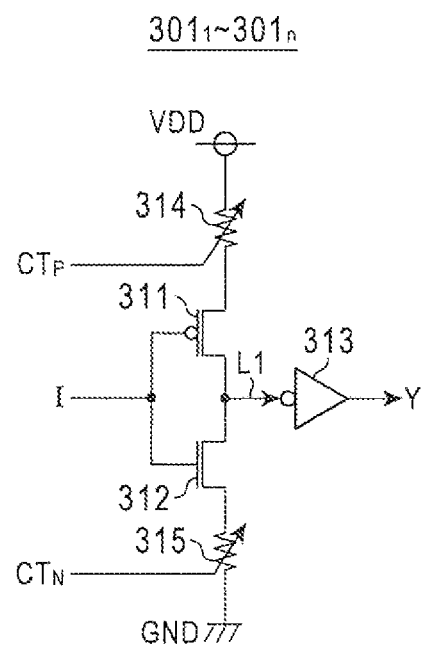
FIG. 6 is a circuit diagram illustrating the internal configuration of each of variable delay circuits $301_1$ to $301n$.

FIG. 6 is a circuit diagram illustrating the internal configuration of each of the variable delay circuits $301_1$ to $301n$.

In FIG. 6, the gate terminal of each of a p-channel metal-oxide semiconductor (MOS) type transistor 311 and an n-channel MOS type transistor 312 is connected to an input terminal I, while the drain terminal of each of the transistors is connected to the input terminal of an inverter 313 through a line L1. The transistor 311 has the source terminal to which the supply voltage VDD is applied through a variable resistor 314. The variable resistor 314 is varied in resistance value in accordance with the delay adjustment signal $CT_P$. The transistor 312 has the source terminal to which the ground voltage GND is applied through a variable resistor 315. The variable resistor 315 is varied in resistance value in accordance with the delay adjustment signal $CT_N$. Thus, when a voltage associated with logic level 0 is applied to the input terminal I, the transistor 311 of the transistors 311 and 312 is turned ON, allowing a current to flow into the line L1 through the variable resistor 314 and the transistor 311. This allows the line L1 to be charged, so that the voltage of the line L1 increases with time. Here, the voltage of the line L1 exceeds the threshold voltage of the inverter 313 after a lapse of 0.5 UI since the voltage associated with logic level 1 has started to be applied to the input terminal I. Thus, the inverter 313 issues, through the output terminal Y, a signal that transitions from logic level 1 to logic level 0. At this time, an increase in the resistance value of the variable resistor 314 in accordance with the delay adjustment signal $CT_P$ causes a decrease in the amount of current for charging the line L1, so that the rate of increase in the voltage of the line L1 with time is decreased. Thus, it takes more time for the voltage to exceed the threshold voltage of the inverter 313, so that the inverter 313 issues the voltage associated with logic level 0 to the output terminal Y at a delayed timing. On the other hand, when a voltage associated with logic level 1 is applied to the input terminal I, the transistor 312 of the transistors 311 and 312 is turned ON, thereby causing a current to be drawn from the line L1 through the transistor 312 and the variable resistor 315. This allows the line L1 to be discharged, so that the voltage of the line L1 is dropped with time. Here, the voltage of the line L1 falls below the threshold voltage of the inverter 313 after a lapse of 0.5 UI since the voltage associated with logic level 0 starts to be applied to the input terminal I. Thus, the inverter 313 issues, through the output terminal Y, a signal that transitions from logic level 0 to logic level 1. At this time, an increase in the resistance value of the variable resistor 315 in accordance with the delay adjustment signal $CT_N$ causes a decrease in the amount of current for discharging the line L1, thus decreasing the drop rate of the voltage of the line L1 with time. Thus, it takes more time for the voltage to fall below the threshold voltage of the inverter 313, so that the inverter 313 delivers the voltage associated with logic level 1 to the output terminal Y at a delayed timing.

The aforementioned arrangement allows the variable delay circuit $301_1$ to delay the aforementioned reference clock signal CLK supplied to the input terminal I by 0.5 UI as shown in FIG. 2 and to issue the resulting signal as the reproduced clock signal $CK_1$ through the output terminal Y as well as to supply the resulting signal to the input terminal I of the variable delay circuit $301_2$ on the next stage. The variable delay circuit $301_2$ delays the reproduced clock signal $CK_1$ by 0.5 UI as shown in FIG. 2 and issues the resulting signal as the reproduced clock signal $CK_2$ through the output terminal Y as well as supplies the resulting signal to the input terminal I of the variable delay circuit $301_3$ on the next stage. The variable delay circuit $301_3$ delays the reproduced clock signal $CK_2$ by 0.5 UI as shown in FIG. 2 and issues the resulting signal through the output terminal Y as the reproduced clock signal $CK_3$ as well as supplies the resulting signal to the input terminal I of the variable delay circuit $301_4$ on the next stage. Likewise, from that point onward, each of the variable delay circuits $301_4$ to $301_{n-1}$ delays the reproduced clock signal CK supplied from the variable delay circuit 301 on the preceding stage by 0.5 UI as shown in FIG. 2 and issues the resulting signal as the reproduced clock signals $CK_4$ to $CK_{n-1}$ through each output terminal Y as well as supplies the resulting signal to the input terminal I of the variable delay circuit 301 on the next stage. Furthermore, the variable delay circuit $301n$ on the final stage delays the reproduced clock signal $CK_{n-1}$ supplied from the variable delay circuit $301_{n-1}$ on the preceding stage by 0.5 UI as shown in FIG. 2 and issues the resulting signal as the reproduced clock signal CKn through the output terminal Y.

As described above, the variable delay circuits $301_1$ to $301n$ adjust each time delay (0.5 UI) in accordance with the delay adjustment signals $CT_P$ and $CT_N$ supplied from the aforementioned phase control circuit 33. This allows the multi-phase clock generation unit 30 having the variable delay circuits $301_1$ to $301n$ to output the reproduced clock signals $CK_1$ to CKn to which phase correction has been made in order to converge the difference in phase between the reference clock signal CLK and the reproduced clock signal CKn to zero.

That is, the DLL circuit 3 that includes the multi-phase clock generation unit 30, the phase comparator 31, the charge pump 32, and the phase control circuit 33 generates the reproduced clock signals $CK_1$ to CKn which have been sequentially delayed by 0.5 UI as shown in FIG. 2 while making a phase correction so as to converge the phase error with respect to the reference clock signal CLK to zero. At this time, the DLL circuit 3 supplies CKn of the reproduced clock signals $CK_1$ to CKn to the phase comparator 31 and supplies $CK_2$ to the clock generation unit 2. Furthermore, the DLL circuit 3 supplies $CK_1$ and $CK_2$ of the reproduced clock signals $CK_1$ to CKn to an ENABLE clock selection unit 4 as well as supplies the reproduced clock signals $CK_1$ to CKn to a clock selector 5.

The ENABLE clock selection unit 4 first detects the phase difference between the reproduced clock signals $CK_1$ and $CK_2$ and detects the unit data period UI as shown in FIG. 2 on the basis of the phase difference. For example, since the phase difference between the reproduced clock signals $CK_1$ and $CK_2$ is equivalent to 0.5 UI or the time delay of the variable delay circuit $301_2$, the ENABLE clock selection unit 4 doubles the phase difference detected as mentioned above, thereby determining the unit data period UI. Next, the ENABLE clock selection unit 4 selects a clock phase coefficient ZZ that meets the equation below on the basis of the unit data period UI.

$$2.7 \times UI - W_{CLK} > ZZ \times UI > 2.3 \times UI,$$

where $W_{CLK}$ is the pulse width of CLKX2.

Note that the clock phase coefficient ZZ represents the rising edge timing of each of the reproduced clock signals $CK_1$ to CKn relative to the rising edge timing of the reference clock signal CLK. For example, in FIG. 2, since the reproduced clock signal CKn is in phase with the reference clock signal CLK, the clock phase coefficient ZZ is zero. On the other hand, since the reproduced clock signal $CK_{n-1}$ advances in phase by 0.5 UI relative to the reference clock signal CLK, the clock phase coefficient ZZ is 0.5. That is, each of the reproduced clock signals $CK_1$ to CKn is assigned the clock phase coefficient ZZ associated therewith. In this context, the ENABLE clock selection unit 4 selects one of the clock phase coefficients ZZ satisfying the equation above each assigned to each of the reproduced clock signals $CK_1$ to CKn, and then selects one reproduced clock signal CK associated with the selected clock phase coefficient ZZ as an ENABLE clock signal $CK_{(X)}$ for generating the rising edge, i.e., the front edge of the ENABLE signal. Then, the ENABLE clock selection unit 4 supplies a clock select signal $S_{CK}$ for selecting this ENABLE clock signal $CK_{(X)}$ to the clock selector 5.

The clock selector 5 selects the ENABLE clock signal $CK_{(X)}$ indicated by the clock select signal $S_{CK}$ from the reproduced clock signals $CK_1$ to CKn, and then supplies the ENABLE clock signal $CK_{(X)}$ to an ENABLE signal generation unit 61. Furthermore, the clock selector 5 selects, from the reproduced clock signals $CK_1$ to CKn, a reproduced clock signal $CK_{(X-2)}$ that is delayed in phase by 1 UI with respect to the reproduced clock signal CK that has been selected as described above, and then supplies the resulting signal to an ENABLE signal generation unit 6.

Figure 7:
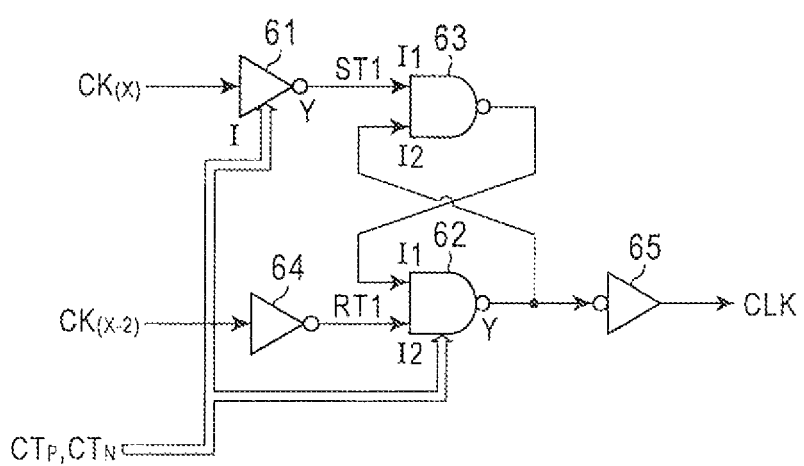
FIG. 7 is a circuit diagram illustrating an example of the internal configuration of an ENABLE signal generation unit 6.

FIG. 7 is a circuit diagram illustrating the internal configuration of the ENABLE signal generation unit 6.

As shown in FIG. 7, the ENABLE signal generation unit 6 includes an RSFF that is made up of a variable delay inverter 61, a variable delay NAND gate 62, a NAND gate 63, and inverters 64 and 65.

The variable delay inverter 61 supplies an inverted set signal to the input terminal I1 of the NAND gate 63, the inverted set signal being obtained by inverting the logic level of the ENABLE clock signal $CK_{(X)}$ supplied from the clock selector 5. Note that the variable delay inverter 61 supplies the aforementioned inverted set signal to the NAND gate 63 with a delay of 0.5 UI from a point in time at which the ENABLE clock signal $CK_{(X)}$ has transitioned from logic level 0 to logic level 1. At this time, the time delay at the variable delay inverter 61 is adjusted so as to retain 0.5 UI at all times in accordance with the delay adjustment signal ($CT_P$, $CT_N$). The inverter 64 supplies an inverting reset signal to the variable delay NAND gate 62, the inverting reset signal being obtained by inverting the logic level of the reproduced clock signal $CK_{(X-2)}$ supplied from the clock selector 5. The input terminal I1 of the variable delay NAND gate 62 is connected with the output terminal of the NAND gate 63, while the output terminal of the variable delay NAND gate 62 is connected with the input terminal I2 of the NAND gate 63 and the input terminal of the inverter 65. Note that the variable delay NAND gate 62 supplies, to each of the NAND gate 63 and the inverter 65, an output result therefrom with a delay of 0.5 UI from a point in time at which the reproduced clock signal $CK_{(X-2)}$ has transitioned from logic level 0 to logic level 1. At this time, the time delay at the variable delay NAND gate 61 is adjusted so as to retain 0.5 UI at all times in accordance with the delay adjustment signal ($CT_P$, $CT_N$). The inverter 65 outputs the ENABLE signal EN which has been obtained by inverting the logic level of the signal issued from the variable delay NAND gate 62. Note that the variable delay NAND gate 62 has the same internal configuration as that shown in FIG. 4, whereas the variable delay inverter 61 has an internal configuration in which the inverter 313 is eliminated from that shown in FIG. 6.

As shown in FIG. 2, such an arrangement allows the ENABLE signal generation unit 6 to generate the ENABLE signal EN having a pulse waveform which transitions from logic level 0 to logic level 1 in response to the ENABLE clock signal $CK_{(X)}$ and which transitions from logic level 1 to logic level 0 in response to the reproduced clock signal $CK_{(X-2)}$. That is, the ENABLE signal generation unit 6 generates the front edge of the ENABLE signal EN indicative of an interval including the reference transition TC as shown in FIG. 2 in response to the ENABLE clock signal $CK_{(X)}$ of the reproduced clock signals $CK_1$ to CKn, while generating the rear edge of the ENABLE signal EN in response to the reproduced clock signal $CK_{(X-2)}$. Note that by including the variable delay inverter 61 and the variable delay NAND gate 62 mentioned above, the ENABLE signal generation unit 6 outputs the ENABLE signal EN with a delay of 1.0 UI from the front edge timing of the ENABLE clock signal $CK_{(X)}$ or $CK_{(X-2)}$ as shown in FIG. 2. At this time, such a time delay is adjusted so as to retain 1.0 UI at all times in accordance with the delay adjustment signal ($CT_P$, $CT_N$). That is, the variable delay inverter 61 and the variable delay NAND gate 62 operate as variable delay issue means for issuing the ENABLE clock signal $CK_{(X)}$ at a timing delayed by the unit data period UI. The ENABLE signal generation unit 6 supplies the ENABLE signal EN generated as described above to the clock generation unit 2.

Now, a description will be made to the operation of the clock data recovery circuit 100 shown in FIG. 1 for generating the reproduced clock signal (CK).

First, the transition detection unit 1 detects the front edge and the rear edge of the received data signal DIN at which the value of a data bit transitions, and generates the transition detection signal CLKX2 as shown in FIG. 2 which has a short pulse waveform that transitions from logic level 0 to logic level 1 at the point in time of detecting each of the edges.

Next, the clock generation unit 2 generates the reference clock signal CLK synchronized with the reference transition TC as shown in FIG. 2 in response to the ENABLE signal EN at logic level 1 for acquiring only a pulse associated with the reference transition TC from the transition detection signal CLKX2.

Then, the DLL circuit 3 generates and outputs the multi-phase reproduced clock signals $CK_1$ to CKn which are each delayed in phase by 0.5 UI in synch with the reference clock signal CLK.

Figure 8:
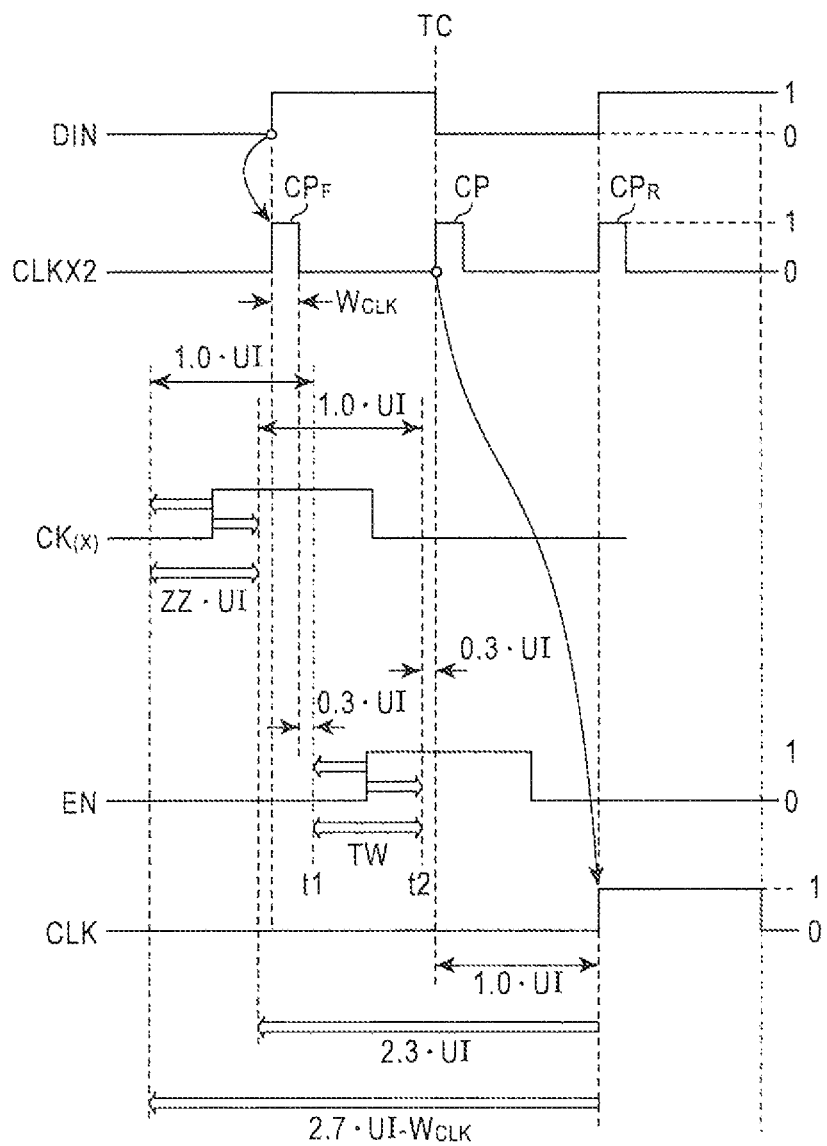
FIG. 8 is an example of a time chart showing the timing of issuing an ENABLE signal EN and the timing of an ENABLE clock signal $CK_{(X)}$ used to generate the ENABLE signal EN.

At this time, to generate the aforementioned ENABLE signal EN, the ENABLE generation means that is made up of the ENABLE clock selection unit 4, the clock selector 5, and the ENABLE signal generation unit 6 first determines the unit data period UI shown in FIG. 2 on the basis of the reproduced clock signals ($CK_1$ and $CK_2$). Then, the ENABLE generation means generates the ENABLE signal EN of which front edge appears within a range TW from point in time t1 to t2 as shown in FIG. 8, on the basis of the unit data period UI. Note that the point in time t1 is a marginal point in time at which with a jitter margin of 0.3 UI added, the front edge of the ENABLE signal EN does not temporally overlap with a pulse $CP_F$ immediately before a pulse CP associated with the reference transition TC of the transition detection signal CLKX2. That is, when the front edge of the ENABLE signal EN appears at a point in time prior to the point in time t1, the pulse $CP_F$ immediately before the pulse CP that is primarily to be acquired would be captured, thereby causing degradation in the accuracy of the reference clock signal CLK. Furthermore, the point in time t2 is a point in time which is temporally ahead of the front edge of the aforementioned pulse CP by a set-up time when a jitter margin of 0.3 UI is taken into account. That is, when the front edge of the ENABLE signal EN appears at a point in time after the point in time t2, the pulse CP cannot be acquired with reliability, causing degradation in the accuracy of the reference clock signal CLK.

In this context, to generate the aforementioned ENABLE signal EN, the ENABLE generation means (4 to 6) first allow the ENABLE clock selection unit 4 and the clock selector 5 to select one of the reproduced clock signals $CK_1$ to CKn as the ENABLE clock signal $CK_{(X)}$ for generating an ENABLE signal. Then, the ENABLE signal generation unit 6 generates the front edge of the ENABLE signal EN in response to the ENABLE clock signal $CK_{(X)}$ as well as the rear edge of the ENABLE signal EN in response to the reproduced clock signal $CK_{(X-2)}$. That is, the front edge of the ENABLE signal EN appears after a lapse of a processing time delay by the ENABLE signal generation unit 6 with respect to the ENABLE clock signal $CK_{(X)}$ selected. At this time, the processing time delay by the ENABLE signal generation unit 6 is defined as 1.0 UI by the variable delay inverter 61 and the variable delay NAND gate 62 which are provided in the ENABLE signal generation unit 6. Thus, as shown in FIG. 8, the ENABLE clock selection unit 4 and the clock selector 5 select the ENABLE clock signal $CK_{(X)}$ the front edge of which is included in a range (ZZ UI) obtained by shifting temporally ahead by 1.0 UI and making no change to the range TW of the points in time t1 to t2 in which the front edge of the ENABLE signal EN is to be included. At this time, as mentioned above, the front edge timing of each of the reproduced clock signals $CK_1$ to CKn is expressed by the clock phase coefficient ZZ with respect to the front edge timing of the reference clock signal CLK. Furthermore, as shown in FIG. 8, the variable delay NAND gates 21 and 22 formed in the clock generation unit 2 delay the reference clock signal CLK by 1.0 UI from the front edge of the pulse CP of the transition detection signal CLKX2 and then output the resulting signal. In this context, to generate the ENABLE signal EN the front edge of which is included in the range TW shown in FIG. 8, the ENABLE clock selection unit 4 and the clock selector 5 select, from the reproduced clock signals $CK_1$ to CKn, the ENABLE clock signal $CK_{(X)}$ the front edge of which is included in the range (ZZ UI) that satisfies the aforementioned equation as shown in FIG. 8.

Thus, according to the ENABLE generation means (4 to 6), the front edge of the ENABLE signal indicative of an interval associated with the reference transition (TC) is generated, by following the unit data period UI, with the timing (within the range TW) which ensures that only the pulse CP associated with the reference transition TC can be acquired from the transition detection signal CLKX2.

Thus, even when the unit data period UI is reduced in a high-speed communication operation, a highly accurate reference clock signal CLK is obtained only in sync with the reference transition TC of the received data signal DIN. It is thus possible to reproduce the multi-phase reproduced clock signals ($CK_1$ to CKn) that have mutually different phases on the basis of the reference clock signal CLK.

Now, a description will be made to the operation of avoiding a false lock by the false-lock avoidance circuit 34 included in the DLL circuit 3.

Figure 9:
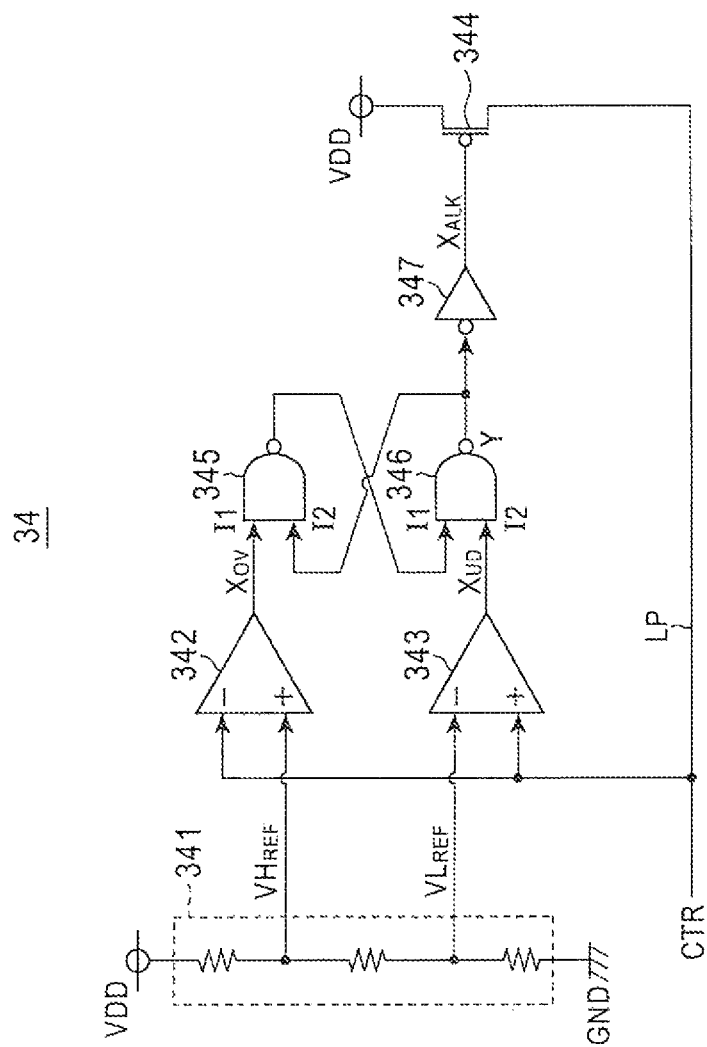
FIG. 9 is a circuit diagram illustrating an example of the internal configuration of a false-lock avoidance circuit 34.

FIG. 9 is a circuit diagram illustrating an example of the internal configuration of the false-lock avoidance circuit 34.

As shown in FIG. 9, the false-lock avoidance circuit 34 includes a potential divider circuit 341, comparators 342 and 343, a p-channel MOS type transistor 344, NAND gates 345 and 346, and an inverter 347.

Figure 10:
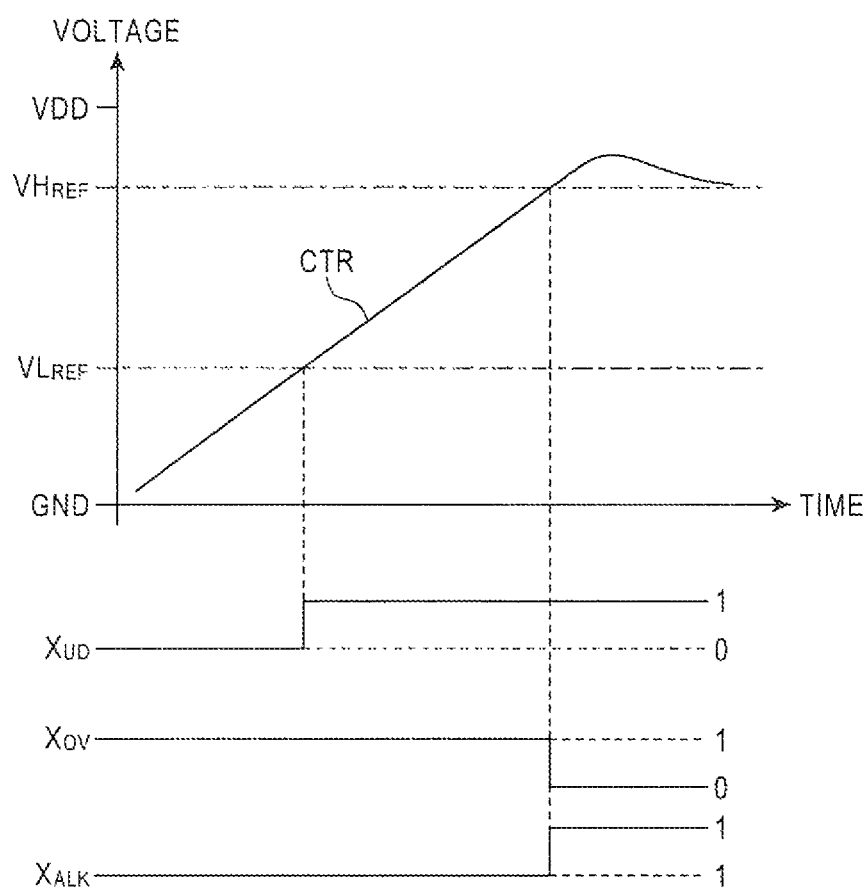
FIG. 10 is a time chart showing an internal operation of the false-lock avoidance circuit 34.

The potential divider circuit 341 generates an upper-limit reference voltage value $VH_{REF}$ lower than the supply voltage VDD and a lower-limit reference voltage value $VL_{REF}$ lower than $VH_{REF}$ as shown in FIG. 10 using a plurality of resistors connected in series between the supply voltage VDD and the ground voltage GND.

The comparator 342 compares magnitudes between the aforementioned upper-limit reference voltage value $VH_{REF}$ and the phase control voltage CTR delivered from the charge pump 32. As shown in FIG. 10, the comparator 342 supplies, to the input terminal I1 of the NAND gate 345, an upper-limit-over signal $X_{OV}$ that is indicative of logic level 1 when the phase control voltage CTR is equal to or less than the upper-limit reference voltage value $VH_{REF}$, and is indicative of logic level 0 when the phase control voltage CTR is greater than the upper-limit reference voltage value $VH_{REF}$.

The comparator 343 compares magnitudes between the aforementioned lower-limit reference voltage value $VL_{REF}$ and the phase control voltage CTR delivered from the charge pump 32. As shown in FIG. 10, the comparator 343 supplies, to the input terminal I2 of the NAND gate 346, a lower-limit-under signal $X_{UD}$ that is indicative of logic level 1 when the phase control voltage CTR is equal to or greater than the lower-limit reference voltage value $VL_{REF}$, and is indicative of logic level 0 when the phase control voltage CTR is less than the lower-limit reference voltage value $VL_{REF}$.

The output terminal of the NAND gate 345 is connected with the input terminal I1 of the NAND gate 346. The output terminal of the NAND gate 346 is connected with the input terminal I2 of the NAND gate 345 and the input terminal of the inverter 347. The inverter 347 supplies a precharge control signal $X_{ALK}$ to the precharge gate terminal of the transistor 344, the precharge control signal $X_{ALK}$ being obtained by inverting the logic level of a signal issued from the NAND gate 346.

That is, the RSFF made up of the NAND gates 345 and 346, and the inverter 347 is reset in response to the lower-limit-under signal $X_{UD}$ indicative of logic level 0. That is, this RSFF is reset when the phase control voltage CTR has transitioned from a state of being equal to or greater than the lower-limit reference voltage value $VL_{REF}$ to a state of being less than the $VL_{REF}$, and supplies the precharge control signal $X_{ALK}$ at logic level 0 to the gate terminal of the transistor 344, the precharge control signal $X_{ALK}$ being indicative of the execution of precharging. On the other hand, the RSFF is turned to a set state in response to the upper-limit-over signal $X_{OV}$ indicative of logic level 0. That is, this RSFF is turned to a set state when the phase control voltage CTR has transitioned from a state of being equal to or less than the upper-limit reference voltage value $VH_{REF}$ to a state of being greater than the $VH_{REF}$, and supplies, to the gate terminal of the transistor 344, the precharge control signal $X_{ALK}$ at logic level 1 indicative of stopping of precharging.

The source terminal of the transistor 344 is supplied with the supply voltage VDD, with the drain terminal connected to a supply line of the phase control voltage CTR or the line LP. The transistor 344 is turned ON only when the precharge control signal $X_{ALK}$ that is at logic level 0 indicative of the execution of precharging is supplied to precharge the line LP at the supply voltage VDD.

Figure 11:
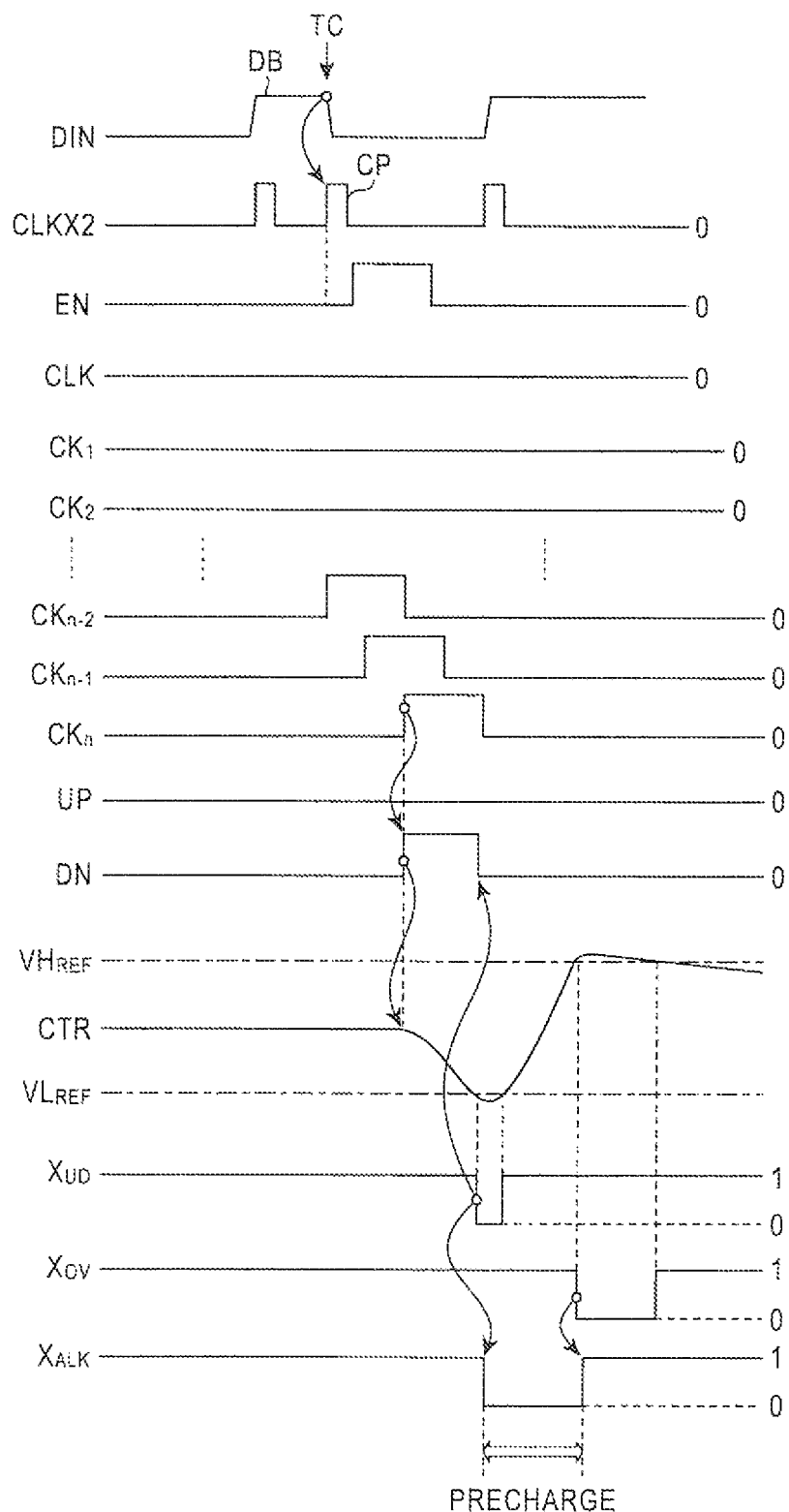
FIG. 11 is a time chart showing an example of a false-lock avoidance operation performed by the false-lock avoidance circuit 34.

FIG. 11 is a time chart showing an example of the false-lock avoidance operation to be performed by the false-lock avoidance circuit 34 when the pulse CP associated with the reference transition TC from the transition detection signal CLKX2 cannot be acquired because of a delay in the ENABLE signal EN caused by external noise.

As shown in FIG. 11, when the pulse CP associated with the reference transition TC cannot be acquired, the clock generation unit 2 is to issue the reference clock signal CLK containing no clock pulse. At this time, although a new reproduced clock signal CK synchronized with the pulse CP is not generated any more, the reproduced clock signal CKn synchronized with the pulse CP of the previously acquired transition detection signal CLKX2 is supplied to the phase comparator 31. Thus, since only a clock pulse of the reproduced clock signal CKn is supplied, the phase comparator 31 starts to supply only the DN of the charge-up signal UP and the charge-down signal DN to the charge pump 32 as shown in FIG. 11. In response to the charge-down signal DN, the charge pump 32 decreases the voltage value of the phase control voltage CTR as shown in FIG. 11. Here, when the voltage value of the phase control voltage CTR falls below $VL_{REF}$, the comparator 343 of the false-lock avoidance circuit 34 generates the lower-limit-under signal $X_{UD}$ that transitions into logic level 0 as shown in FIG. 11. In response to the lower-limit-under signal $X_{UD}$, the RSFFs (345 to 347) of the false-lock avoidance circuit 34 are reset to supply the precharge control signal $X_{ALK}$ at logic level 0 to the precharge transistor 344. Thus, meanwhile, the transistor 344 precharges the line LP at the supply voltage VDD. This allows the voltage value of the phase control voltage CTR to gradually increase as shown in FIG. 11. Here, when the voltage value of the phase control voltage CTR exceeds $VH_{REF}$, the comparator 342 of the false-lock avoidance circuit 34 generates the upper-limit-over signal $X_{OV}$ that transitions into logic level 0 as shown in FIG. 11. In response to the upper-limit-over signal $X_{OV}$, the RSPFs (345 to 347) of the false-lock avoidance circuit 34 are turned into a set state to supply the precharge control signal $X_{ALK}$ at logic level 1 to the precharge transistor 344. Thus, in response to the precharge control signal $X_{ALK}$ at logic level 1, the transistor 344 stops precharging of the line LP.

Thus, the aforementioned operation of precharging the line LP causes the voltage value of the phase control voltage CTR to be retained at around a relatively high voltage in the vicinity of the predetermined upper-limit reference voltage value $VH_{REF}$ as shown in FIG. 11. That is, the line LP is precharged even when external noise causes only the charge-down signal DN to be continually issued by the phase comparator 31 to the charge pump 32, that is, the charge pump has stopped operating. It is thus possible to retain the voltage value of the phase control voltage CTR at a high voltage value in the vicinity of $VH_{REF}$.

Subsequently thereafter, when the pulse CP associated with the reference transition TC from the transition detection signal CLKX2 starts to be acquired, the DLL circuit 3 starts initial synchronization with the phase control voltage CTR at a high voltage value in the vicinity of the upper-limit reference voltage value $VH_{REF}$.

Thus, according to the false-lock avoidance circuit 34, it is possible to avoid a false lock which would be otherwise caused when the DLL circuit 3 starts initial synchronization with the phase control voltage CTR at a low voltage in the vicinity of the ground voltage GND.

Note that since the charge pump 32 may operate with instability immediately after power-on even in the absence of external noise, there may occur a false lock depending on the supply voltage value being supplied or the environment temperature.

Figure 12:
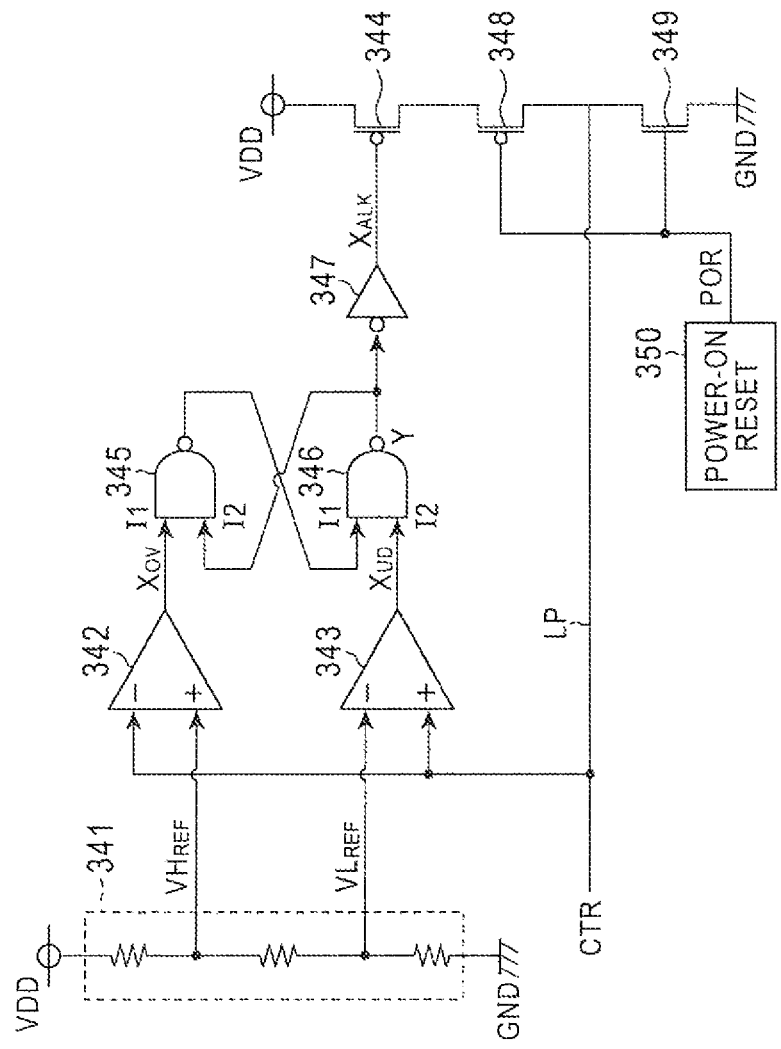
FIG. 12 is a circuit diagram illustrating another example of the internal configuration of the false-lock avoidance circuit 34.

FIG. 12 is a circuit diagram illustrating another example of the internal configuration of the false-lock avoidance circuit 34 which is capable of preventing a false lock that could occur immediately after power-on.

Note that the arrangement shown in FIG. 12 is the same as that shown in FIG. 9 except that a p-channel MOS type transistor 348, an n-channel MOS type transistor 349, and a power-ON reset circuit 350 are additionally included.

That is, in the arrangement shown in FIG. 12, the drain terminal of the transistor 344 is connected to the source terminal of the transistor 348, with the drain terminal of the transistor 348 connected to the line LP. Furthermore, the drain terminal of the transistor 349 is connected to the line LP, with the source terminal held at the ground voltage GND. The power-ON reset circuit 350 generates a one-pulse power-ON reset signal POR which is turned to a high level only for a duration TQ as shown in FIG. 13 in response to power-on, and then supplies the resulting signal to the gate terminal of each of the transistors 348 and 349.

Figure 13:
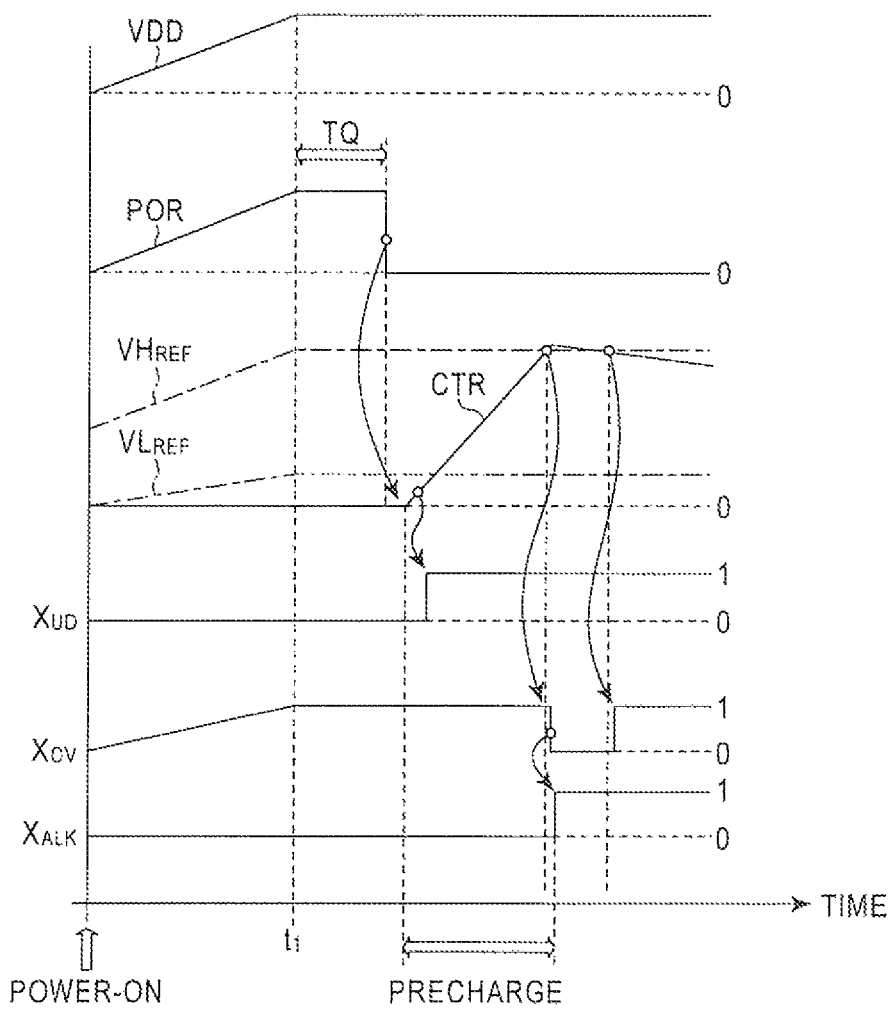
FIG. 13 is a time chart showing an example of a false-lock avoidance operation performed by the false-lock avoidance circuit 34 illustrated in FIG. 12.

FIG. 13 is a time chart showing an example of the false-lock avoidance operation to be performed by the false-lock avoidance circuit 34 immediately after power-on.

First, when the power of the clock data recovery circuit 100 starts to be turned on, the voltage value of the supply voltage VDD gradually increases with time and reaches a desired peak voltage value at point in time t1. Following the transition of the voltage value of the supply voltage VDD, the power-ON reset signal POR, the upper-limit reference voltage value $VH_{REF}$, and the lower-limit reference voltage value $VL_{REF}$ also gradually increase as shown in FIG. 13, reach the respective peak voltage values at point in time t1, and sustain the respective states. Here, in the case of the power-ON reset signal POR, the voltage value thereof transitions to the level of the ground voltage GND (0 volt) at a point in time at which a duration TQ has elapsed from the point in time t1. Note that while the power-ON reset signal POR is at a high voltage value, the transistor 348 is in an OFF state and the transistor 349 is in an ON state. This causes the line LP to be at the ground voltage GND, i.e., discharged. Therefore, the voltage value of the phase control voltage CTR or the output value of the charge pump 32 is retained at the ground voltage GND (0 volt). Note that meanwhile, since the transistor 348 is in an OFF state, the flow-through current flowing through a current flow path of the transistors 344, 348 and 349 is prevented.

Subsequently, when the voltage value of the power-ON reset signal POR has transitioned to 0 volt, the transistor 349 is turned OFF and the transistor 348 is turned ON, thus starting precharging of the line LP. This allows the voltage value of the phase control voltage CTR to gradually increase as shown in FIG. 13. Then, when the voltage value of the phase control voltage CTR exceeds the upper-limit reference voltage value $VH_{REF}$, the comparator 342 issues the upper-limit-over signal $X_{OV}$ indicative of logic level 0. In response to this, the RSFFs (345 to 347) are turned to a set state, thus supplying the precharge control signal $X_{ALK}$ at logic level 1 to the precharge transistor 344. In response to the precharge control signal $X_{ALK}$ at logic level 1, the transistor 344 stops the operation of precharging the line LP. Thus, for the DLL circuit 3 to subsequently execute the initial synchronization, the initial synchronization is started with the phase control voltage CTR at the supply voltage VDD. Therefore, no false lock will occur.

As described above, the arrangement shown in FIG. 12 is configured such that the line LP is precharged after the line LP is once set to a discharge state (the transistor 349 is turned to an ON state) over the duration TQ immediately after power-on so that the phase control voltage CTR applied from the charge pump 32 to the line LP at power-on will not become indefinite.

Thus, according to such an arrangement, the output voltage value (CTR) from the charge pump 32 that may become unstable immediately after power-on can be retained at a high voltage value in the vicinity of the supply voltage VDD. Thus, in the initial synchronization of the DLL circuit 3 to be first performed after the power-on, a false lock is avoided.

Note that the clock data recovery circuit 100 shown in FIG. 1 employs the DLL circuit (3) as the synchronizing circuit; however, even in the case of a phase locked loop (PLL) circuit employed in place of the DLL circuit, the aforementioned false lock can be avoided in the same manner by the false-lock avoidance circuit 34 shown in FIG. 9 or FIG. 13.

In short, according to the clock data recovery circuit (100) of the present invention, the clock generation means (1, 2) generates a reference clock signal (CLK) synchronized with a data transition point (TC) that appears every predetermined period (P) in an input data signal (DIN). Then, the synchronizing circuit (3) according to the present invention generates a reproduced clock signal (CK) synchronized with the reference clock signal. At this time, the synchronizing circuit includes: the charge pump (32) which generates a phase control voltage (CTR) having a voltage value associated with the phase difference between the reference clock signal and the reproduced clock signal mentioned above, and delivers the resulting voltage to a first line (LP); the phase control circuit (33) for providing phase control to the reproduced clock signal depending on the phase control voltage; and the false-lock avoidance circuit (34) specified as follows. The false-lock avoidance circuit starts to precharge the first line (LP) when the phase control voltage (CTR) falls below a lower-limit reference voltage ($VL_{REF}$) and continues the operation of precharging the first line until this phase control voltage exceeds an upper-limit reference voltage ($VH_{REF}$), thereby retaining the voltage value of the phase control voltage at a high voltage.

This makes it possible to retain the voltage of the phase control voltage at a high voltage value because the first line is forcedly precharged even when the operation of the charge pump is substantially stopped due to external noise. Thus, to subsequently start the initial synchronization by the synchronizing circuit, the synchronizing circuit (3) is to start the initial synchronization with the phase control voltage (CTR) at a high voltage value in the vicinity of the upper-limit reference voltage ($VH_{REF}$). Thus, according to the false-lock avoidance circuit (34), it is possible to avoid a false lock which would otherwise occur when the synchronizing circuit starts the initial synchronization with the phase control voltage at a low voltage in the vicinity of the ground voltage.

This application is based on Japanese Patent Application No. 2012-240380 which is herein incorporated by reference.

What is claimed is:

1. A synchronizing circuit for generating a reproduced clock signal synchronized with a reference clock signal, the synchronizing circuit comprising:
   a charge pump for generating a phase control voltage having a voltage value associated with a phase difference between the reference clock signal and the reproduced clock signal and for delivering the phase control voltage to a first line;
   a phase control circuit for providing phase control to the reproduced clock signal depending on said voltage value the phase control voltage; and
   a false-lock avoidance circuit for starting to precharge the first line when said voltage value of the phase control voltage falls below a lower-limit reference voltage and for continuing the operation of precharging the first line until said voltage value of the phase control voltage exceeds an upper-limit reference voltage.

2. The synchronizing circuit according to claim 1, wherein the false-lock avoidance circuit comprises:
   a first comparator for comparing magnitudes between the phase control voltage and the lower-limit reference voltage and generating a lower-limit-under signal when the phase control voltage is less than the lower-limit reference voltage;
   a second comparator for comparing magnitudes between the phase control voltage and the upper-limit reference voltage and generating an upper-limit-over signal when the phase control voltage is greater than the upper-limit reference voltage, and
   a precharge transistor for precharging the first line by applying a supply voltage to the first line in response to the lower-limit-under signal and for stopping the precharging by stopping the application of the supply voltage to the first line in response to the upper-limit-over signal.

3. The synchronizing circuit according to claim 1, further comprising:
   a power-ON reset circuit for generating a one-pulse power-ON reset signal in response to power-on; and
   a discharge transistor for discharging the first line in response to the power-ON reset signal for a predetermined duration.

4. The synchronizing circuit according to claim 1, further comprising:
   a power-ON reset circuit for generating a one-pulse power-ON reset signal in response to power-on; and
   a discharge transistor for discharging the first line in response to the power-ON reset signal for a predetermined duration.

5. A clock data recovery circuit comprising a clock generation part which generates a reference clock signal synchronized with a data transition point that appears every predetermined period in an input data signal and a synchronizing part which generates a reproduced clock signal synchronized with the reference clock signal,
   the synchronizing part comprising:
   a charge pump for generating a phase control voltage having a voltage value associated with a phase difference between the reference clock signal and the reproduced clock signal and for delivering the phase control voltage to a first line;
   a phase control circuit for providing phase control to the reproduced clock signal depending on said voltage value the phase control voltage; and
   a false-lock avoidance circuit for starting to precharge the first line when said voltage value the phase control voltage falls below a lower-limit reference voltage and for continuing the operation of precharging the first line until said voltage value of the phase control voltage exceeds an upper-limit reference voltage.

6. The clock data recovery circuit according to claim 5, wherein the false-lock avoidance circuit comprises:
   a first comparator for comparing magnitudes between the phase control voltage and the lower-limit reference voltage and generating a lower-limit-under signal when the phase control voltage is less than the lower-limit reference voltage;
   a second comparator for comparing magnitudes between the phase control voltage and the upper-limit reference voltage and generating an upper-limit-over signal when the phase control voltage is greater than the upper-limit reference voltage; and
   a precharge transistor for precharging the first line by applying a supply voltage to the first line in response to the lower-limit-under signal and for stopping the precharging by stopping the application of the supply voltage to the first line in response to the upper-limit-over signal.

7. The clock data recovery circuit according to claim 6, further comprising:
   a power-ON reset circuit for generating a one-pulse power-ON reset signal in response to power-on; and
   a discharge transistor for discharging the first line in response to the power-ON reset signal for a predetermined duration.

8. The clock data recovery circuit according to claim 5, further comprising:
   a power-ON reset circuit for generating a one-pulse power-ON reset signal in response to power-on; and a discharge transistor for discharging the first line in response to the power-ON reset signal for a predetermined duration.

9. A clock data recovery circuit comprising clock generation means for generating a reference clock signal synchronized with a data transition point that appears every predetermined period in an input data signal and synchronizing means for generating a reproduced clock signal synchronized with the reference clock signal, the synchronizing means comprising:

a charge pump for generating a phase control voltage having a voltage value associated with a phase difference between the reference clock signal and the reproduced clock signal and for delivering the phase control voltage to a first line;

a phase control circuit for providing phase control to the reproduced clock signal depending on said voltage value of the phase control voltage; and a false-lock avoidance circuit for starting to precharge the first line when said voltage value of the phase control voltage falls below a lower-limit reference voltage and for continuing the operation of precharging the first line until said voltage value of the phase control voltage exceeds an upper-limit reference voltage.

10. The clock data recovery circuit according to claim 9, wherein the false-lock avoidance circuit comprises:

a first comparator for comparing magnitudes between the phase control voltage and the lower-limit reference voltage and generating a lower-limit-under signal when the phase control voltage is less than the lower-limit reference voltage;

a second comparator for comparing magnitudes between the phase control voltage and the upper-limit reference voltage and generating an upper-limit-over signal when the phase control voltage is greater than the upper-limit reference voltage; and a precharge transistor for precharging the first line by applying a supply voltage to the first line in response to the lower-limit-under signal and for stopping the precharging by stopping the application of the supply voltage to the first line in response to the upper-limit-over signal.

11. The clock data recovery circuit according to claim 10, further comprising:

a power-ON reset circuit for generating a one-pulse power-ON reset signal in response to power-on; and a discharge transistor for discharging the first line in response to the power-ON reset signal for a predetermined duration.

12. The clock data recovery circuit according to claim 9, further comprising:

a power-ON reset circuit for generating a one-pulse power-ON reset signal in response to power-on; and a discharge transistor for discharging the first line in response to the power-ON reset signal for a predetermined duration.

\* \* \* \* \*